(12) United States Patent
Shibata et al.

(10) Patent No.: US 7,238,984 B2
(45) Date of Patent: Jul. 3, 2007

(54) SEMICONDUCTOR MEMORY DEVICE, SEMICONDUCTOR DEVICE, AND PORTABLE ELECTRONIC APPARATUS

(75) Inventors: Akihide Shibata, Nara (JP); Hiroshi Iwata, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 75 days.

(21) Appl. No.: 10/826,612

(22) Filed: Apr. 19, 2004

(65) Prior Publication Data

US 2004/0228200 A1 Nov. 18, 2004

(30) Foreign Application Priority Data

May 14, 2003 (JP) .............................. 2003-136354

(51) Int. Cl.
*H01L 29/792* (2006.01)

(52) U.S. Cl. .................. 257/324; 257/325; 257/326; 257/316; 257/411; 257/E29.309; 257/E27.011

(58) Field of Classification Search ................. 257/324
See application file for complete search history.

(56) References Cited

U.S. PATENT DOCUMENTS 5,838,041 A * 11/1998 Sakagami et al. .......... 257/324
6,335,554 B1 * 1/2002 Yoshikawa .................. 257/316
6,642,586 B2 * 11/2003 Takahashi ................... 257/390
2002/0130356 A1 * 9/2002 Sung et al. ................. 257/316
2003/0005214 A1 * 1/2003 Chan .......................... 711/104
2003/0067032 A1 * 4/2003 Caprara et al. ............. 257/324
2004/0036068 A1 * 2/2004 Li .............................. 257/48

FOREIGN PATENT DOCUMENTS

| JP | 5-81072 B2 | 11/1993 |
|---|---|---|
| JP | 5-304277 A | 11/1993 |
| JP | 9-116119 A | 5/1997 |
| JP | 2001-156188 A | 6/2001 |
| JP | 2001-230332 A | 8/2001 |
| JP | 2001-512290 A | 8/2001 |

* cited by examiner

*Primary Examiner*—Tu-Tu Ho
(74) *Attorney, Agent, or Firm*—Birch, Stewart, Kolasch & Birch, LLP

(57) ABSTRACT

A semiconductor memory device includes a nonvolatile memory section; and a volatile memory section, wherein the nonvolatile memory section includes a nonvolatile memory cell having a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges.

10 Claims, 17 Drawing Sheets

SEMICONDUCTOR MEMORY DEVICE, SEMICONDUCTOR DEVICE, AND PORTABLE ELECTRONIC APPARATUS

CROSS-REFERENCE TO RELATED APPLICATION

This Nonprovisional application claims priority under 35 U.S.C § 119(a) on Patent Application No(s). 2003-136354 filed in JAPAN on May 14, 2003, the entire contents of which are hereby incorporated by reference.

This application is related to Japanese patent application No.2003-136354 filed on May 14, 2003, whose priority is claimed under 35 USC § 119, the disclosure of which is incorporated by reference in its entirety.

BACKGROUND OF THE INVENTION

1. Field of the Invention

The present invention relates to a semiconductor memory device, a semiconductor device including the semiconductor memory device, and a portable electronic apparatus including the semiconductor memory device or the semiconductor device. More specifically, the present invention relates to a semiconductor memory device including a nonvolatile memory cell constructed by field-effect transistors each including a memory functional unit having the function of retaining charges, a semiconductor device including the semiconductor memory device, and a portable electronic apparatus including the semiconductor memory device or the semiconductor device.

2. Description of the Related Art

In general, a microcomputer includes a CPU, a nonvolatile memory and a volatile memory. The nonvolatile memory stores therein a program code and the like, and the volatile memory is used as a work memory. An EEPROM (Electrically Erasable Programmable Read Only Memory) or the like has been conventionally used as the nonvolatile memory.

As an example of the EEPROM, a flash memory will be described below. FIG. 27 is a schematic sectional view showing an example of a flash memory cell. Shown in FIG. 27 are a semiconductor substrate 901, a floating gate 902, a word line (control gate) 903, a diffusion layer source line 904, a diffusion layer bit line 905, a device isolation region 906 and an insulating film 907.

A flash memory cell has a floating gate, and information is held according to an amount of charges in the floating gate. In a memory cell array constructed by arranging memory cells, by selecting a specific word line and a specific bit line and applying a predetermined voltage, an operation of rewriting/reading a desired memory cell can be performed.

FIG. 28 is a graph schematically showing a drain current (Id)-gate voltage (Vg) characteristic when an amount of charges in the floating gate in the flash memory changes. When the amount of negative charges in the floating gate increases, the threshold increases and the Id-Vg curve moves almost in parallel in the Vg increasing direction (see Japanese Unexamined Patent Publication No. Hei 05-304277 (1993)).

However, since the EEPROM includes the floating gate, it has been necessary to pattern two-layered polysilicon in order to form the floating gate and the control gate, thereby causing a complicated process. Therefore, it has been difficult to reduce the cost of the semiconductor memory device including the nonvolatile memory and the volatile memory in addition to the EEPROM per se.

SUMMARY OF THE INVENTION

The present invention has been achieved in consideration of the problems and its object is to provide a semiconductor memory device including both of a nonvolatile memory and a volatile memory at a reduced cost.

According to the present invention, provided is a semiconductor memory device including: a nonvolatile memory section; and a volatile memory section, wherein the nonvolatile memory section includes a nonvolatile memory cell having a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges.

With this configuration, since the nonvolatile memory section includes a memory cell which can be readily fined in a simple fabricating process, it is possible to provide a semiconductor memory device including both of a nonvolatile memory and a volatile memory at low cost. Furthermore, since the difference in current at the time of writing and erasing is easily enlarged in the memory cell, it is possible to increase a speed of reading information stored in the nonvolatile memory section, or to simplify the arrangement of a reading circuit in the nonvolatile memory section.

In an embodiment according to the present invention, the volatile memory section includes an SRAM (Static Random Access Memory).

According to this embodiment, it is possible to suppress electric power consumption in the semiconductor memory device.

In another embodiment according to the present invention, the nonvolatile memory cell and the SRAM are formed on a single chip.

According to this embodiment, a process for forming the nonvolatile memory section has high affinity with a process for forming a transistor having a normal structure. The SRAM can be constructed by a transistor having a normal structure, so that the nonvolatile memory section and the volatile memory section can be mounted in combination on a single chip in a considerably easy process. Consequently, the semiconductor memory device can be reduced in size and, further, can be remarkably reduced in cost.

In a still another embodiment, the volatile memory section includes a DRAM (Dynamic Random Access Memory).

According to this embodiment, it is possible to remarkably reduce an area occupied per bit in the volatile memory section. As a consequence, it is possible to reduce the cost of the semiconductor memory device, or to increase a memory capacity.

In a yet another embodiment, the volatile memory section includes refreshing operation means for refreshing the DRAM.

According to this embodiment, in the case of the combination of an external controller such as a CPU (Central Processing Unit) with the semiconductor memory device, the external controller need not perform any refreshing operation of the volatile memory section, or need not issue a command for performing a refreshing operation with respect to the volatile memory section. Consequently, it is possible to facilitate the design of the external controller. In particular, it is possible to readily make the external controller versatile.

Moreover, in a yet another embodiment, a chip having the nonvolatile memory section formed therein and a chip having the volatile memory section formed therein are mounted in a single package.

According to this embodiment, the semiconductor memory device can be reduced in size.

In addition, a semiconductor device according to the present invention includes the above-described semiconductor memory device and a logical operation section.

With this configuration, since the semiconductor device includes the semiconductor memory device having a memory cell which can be readily fined in a simple fabricating process and the logical operation section, it is possible to provide a semiconductor device capable of performing various kinds of operations at low cost.

In addition, in a yet another embodiment, at least a part of the memory functional unit overlaps with a part of the diffusion region.

According to this embodiment, it is possible to sufficiently increase the reading speed of the nonvolatile memory cell. Consequently, the semiconductor memory device can be actuated at a high speed.

Furthermore, in a yet another embodiment, the memory functional unit includes a retaining film having a function for retaining charges, and a surface of the retaining film is arranged almost in parallel to a surface of the gate insulating film.

According to this embodiment, it is possible to reduce variations in memory effect of the nonvolatile memory cell, so as to suppress variations in reading current of the nonvolatile memory cell. Furthermore, it is possible to reduce variations in characteristics of the nonvolatile memory cell during the information retaining operation, so as to enhance the information retention characteristics of the nonvolatile memory cell. As a consequence, the reliability of the semiconductor memory device is enhanced.

Moreover, in a yet another embodiment, the retaining film is arranged almost in parallel to the side surface of the gate electrode.

According to this embodiment, it is possible to perform a rewriting operation of the nonvolatile memory cell at a high speed since the rewriting speed of the nonvolatile memory cell is increased. As a result, the semiconductor memory device can be actuated at a high speed.

Additionally, in a yet another embodiment, the memory functional unit includes a retaining film having the function for retaining charges and an insulating film for separating the retaining film from one of the channel region and the semiconductor layer, and the insulating film has a thickness smaller than that of the gate insulating film and not smaller than 0.8 nm.

According to this embodiment, it is possible to reduce a voltage during the writing operation and the erasing operation in the nonvolatile memory cell, or to perform the writing operation and the erasing operation at a high speed. Furthermore, since the memory effect of the nonvolatile memory cell is enhanced, the reading speed of the nonvolatile memory section can be increased. Thus, the semiconductor memory device can be actuated at a high speed with reduced electric power consumption.

In addition, in a yet another embodiment, the memory functional unit includes a film having the function of retaining charges and an insulating film for separating the film from the channel region or the semiconductor layer, and the insulating film has a thickness greater than that of the gate insulating film and not greater than 20 nm.

In this embodiment, the satisfactory information retention characteristics can be achieved even when the nonvolatile memory cell is highly integrated since the retention characteristics can be improved without degrading a short channel effect of the nonvolatile memory cell.

Consequently, it is possible to increase the memory capacity of the semiconductor memory device, or to reduce the fabricating cost of the semiconductor memory device.

Moreover, a portable electronic apparatus according to the present invention includes the above-described semiconductor memory device or semiconductor device.

According to the present invention, since the portable electronic apparatus includes the inexpensive semiconductor memory device or semiconductor device, it is possible to reduce the fabricating cost of the portable electronic apparatus.

DETAILED DESCRIPTION OF THE INVENTION

Figure 1:
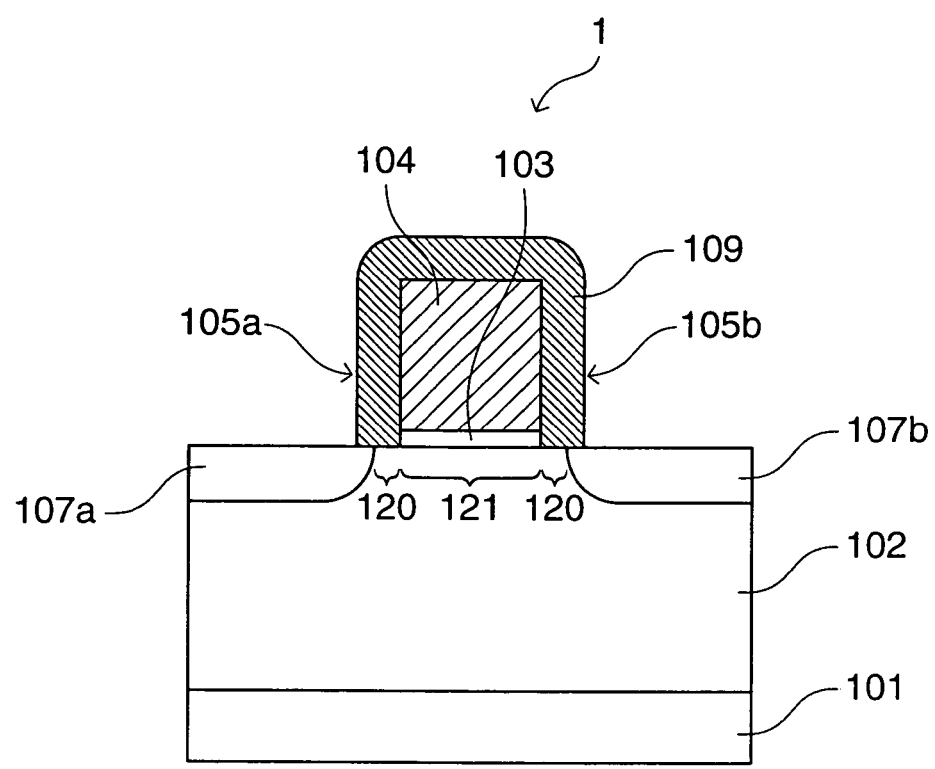
FIG. 1 is a schematic sectional view showing a main part of a memory cell (first embodiment) constituting a nonvolatile memory section of a driving device for display according to the present invention.

A semiconductor memory device according to the present invention is mainly constructed by a nonvolatile memory section and a volatile memory section.

A memory cell forming the nonvolatile memory section is mainly constructed by a semiconductor layer, a gate insulating film, a gate electrode, a channel region, a diffusion region and a memory functional unit. Herein, the channel region is normally a region of the same conductive type as that of the semiconductor layer and located immediately under the gate electrode. The diffusion region is a region of a conductive type opposite to that of the channel region.

Concretely, the memory cell of the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the memory cell of the present invention is constructed by a gate electrode formed on a gate insulating film, two memory functional units formed on both sides of the gate electrode, two diffusion regions disposed on the opposite sides of the gate electrode of the memory functional units, and a channel region disposed below the gate electrode.

In the semiconductor device of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration which is within a known range in this field can be used as impurity concentration in the semiconductor layer and the well region. In the case of using the SOI substrate as the semiconductor layer, the well region may be formed in the surface semiconductor layer and a body region may be provided below a channel region.

The gate insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and examples thereof include a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. Below the gate electrode, a channel region is formed.

Preferably, the gate electrode is formed only on the sidewalls of the memory functional unit or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield in production can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

By using the insulating film including a film having the charge retaining function such as a silicon nitride film as the memory functional unit, reliability of storage and retention can be increased. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

In order to increase the reliability of storage and retention, the film having the charge retaining function does not always have to have a film shape. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternatively, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly preferable that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film may be made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/ charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of these films, a gate electrode material film is formed on the entire surface of the opening, and the gate electrode material film is patterned in a shape including the opening and larger than the opening. As described above, the memory cell of the present invention can be formed by a considerably simple process as compared with an EEPROM having a floating gate. In addition, the process for forming the memory cell of the present invention has high affinity with the process of forming a normal MOSFET; therefore, mounting of the memory cell and the MOSFET in combination becomes easy.

In the case of constructing the memory cell array by arranging memory cells of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is almost parallel with the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. It may be sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the memory cell satisfies the requirements (3) and (9), it is very useful for the following reasons.

First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo etching process for isolating the memory functional unit for each memory cell is preferable, and a margin for positioning in the photolithography process and a margin for film reduction by etching are preferable.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

In the semiconductor memory device according to the present invention, the memory cell and the logic transistor may be mounted on the same chip. In this case, since the process for forming the semiconductor device according to the present invention, in particular, the memory cell has high affinity with the process for forming a standard transistor having a normal structure such as a transistor and a logic transistor, the memory cell and the logic transistor can be formed at the same time. Consequently, the process for mounting the memory cell and the transistor or the logic transistor in combination becomes very simple and easy, thereby achieving an inexpensive device in combination.

In the semiconductor memory device of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device according to the present invention can be widely applied to various kinds of integrated circuits and electronic apparatuses in combination with other memory cells, logic elements, logic circuits or the like. For example, the semiconductor memory device according to the present invention can be used for a portable electronic apparatus, which is driven by a battery, in particular, to a portable information terminal. Examples of the portable electronic apparatus include a portable information terminal, a cellular telephone, a game apparatus and the like.

DESCRIPTION OF THE PREFERRED EMBODIMENTS

Hereinafter, embodiments of a semiconductor memory device, a semiconductor device and a portable electronic apparatus of the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
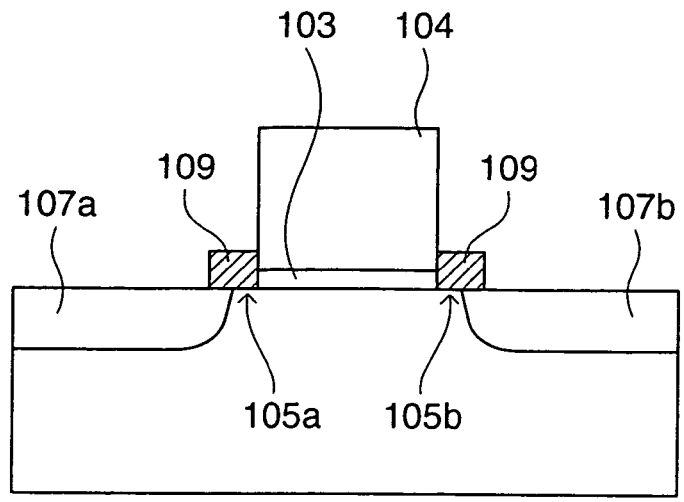
FIGS. 2A and 2B are schematic sectional views each showing a main part of a modification of the memory cell (first embodiment) constituting the nonvolatile memory section of the driving device for display according to the present invention.
Figure 2B:
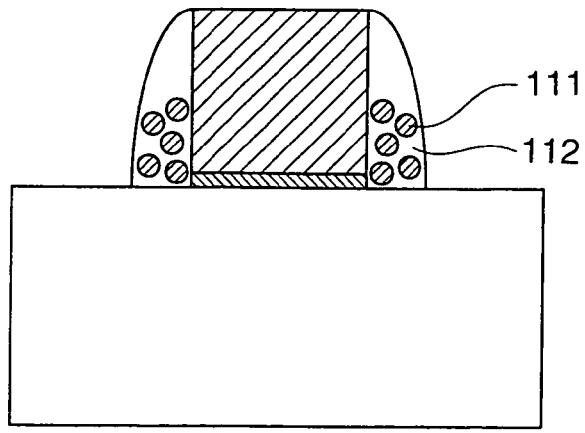

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described. "Writing" denotes herein injection of electrons into the memory functional units 131a and 131b when the memory cell is of the N channel type. Hereinafter, on assumption that the memory cell is of the N channel type, description will be given.

Figure 3:
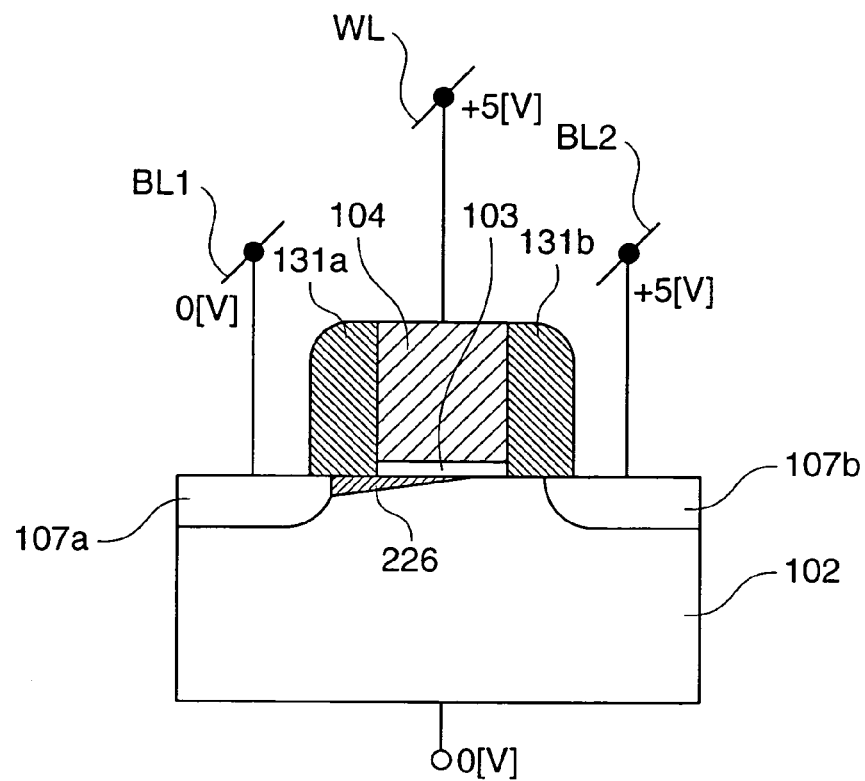
FIG. 3 is a diagram for describing a writing operation of the memory cell (first embodiment) constituting the nonvolatile memory section of the driving device for display according to the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
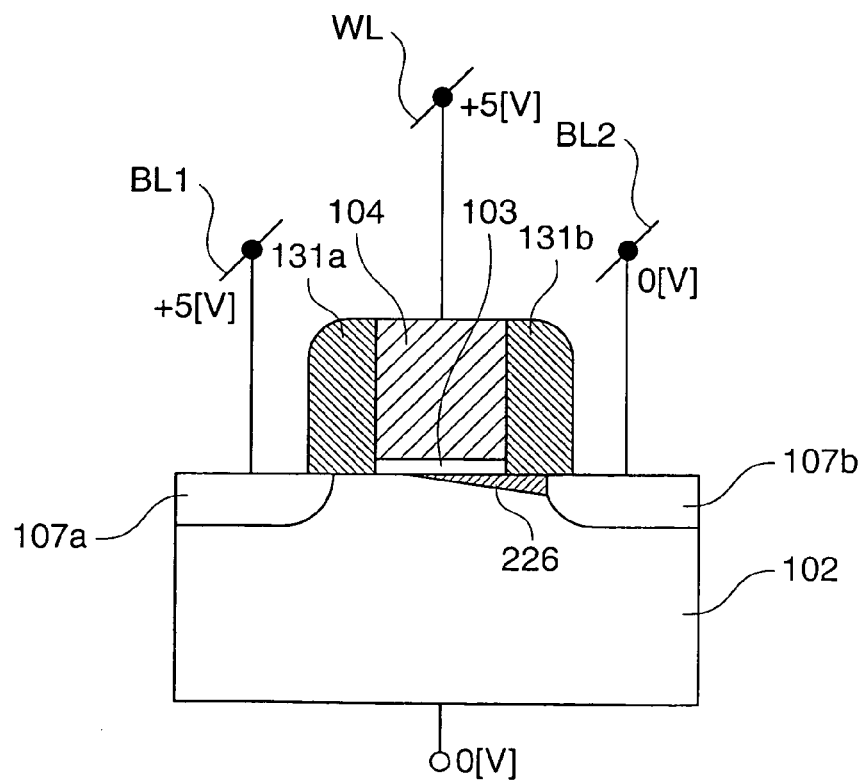
FIG. 4 is a diagram for describing a writing operation of the memory cell (first embodiment) constituting the nonvolatile memory section of the driving device for display according to the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the memory cell will now be described with reference to FIGS. 5 and 6.

Figure 5:
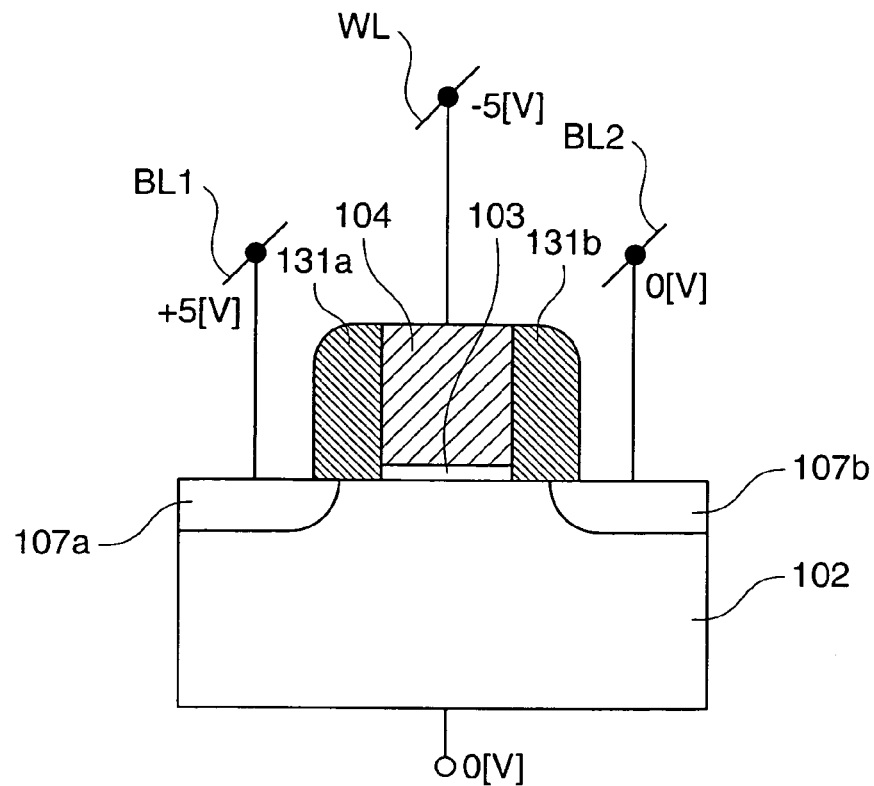
FIG. 5 is a diagram for describing an erasing operation of the memory cell (first embodiment) constituting the nonvolatile memory section of the driving device for display according to the present invention.

In a first method of erasing information stored in the first memory functional unit 131a, by applying positive voltage (for example, +5V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
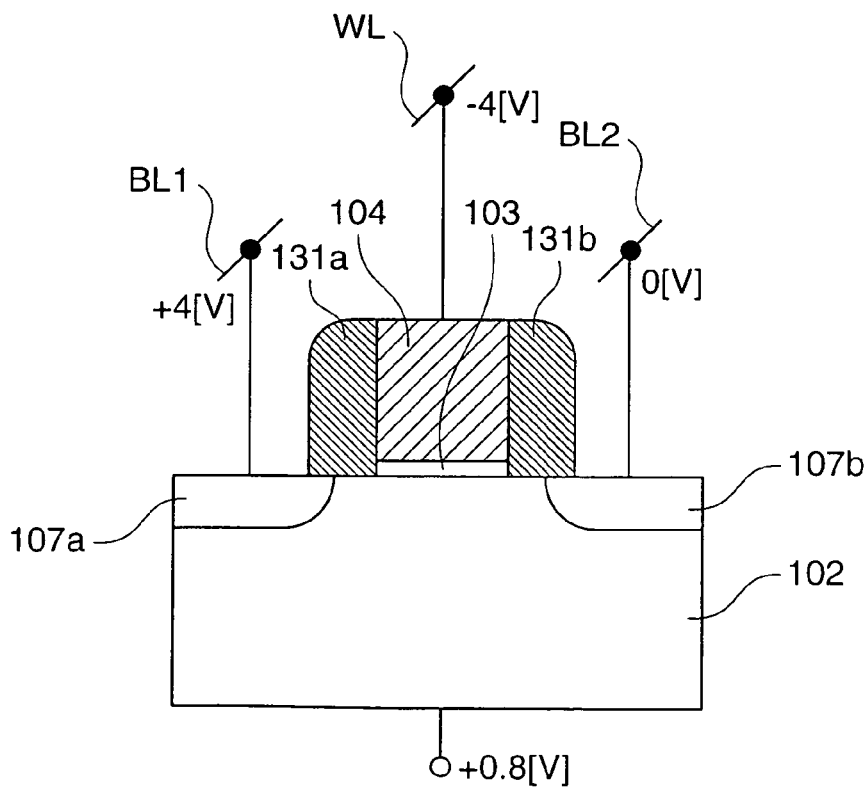
FIG. 6 is a diagram for describing an erasing operation of the memory cell (first embodiment) constituting the nonvolatile memory section of the driving device for display according to the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Figure 7:
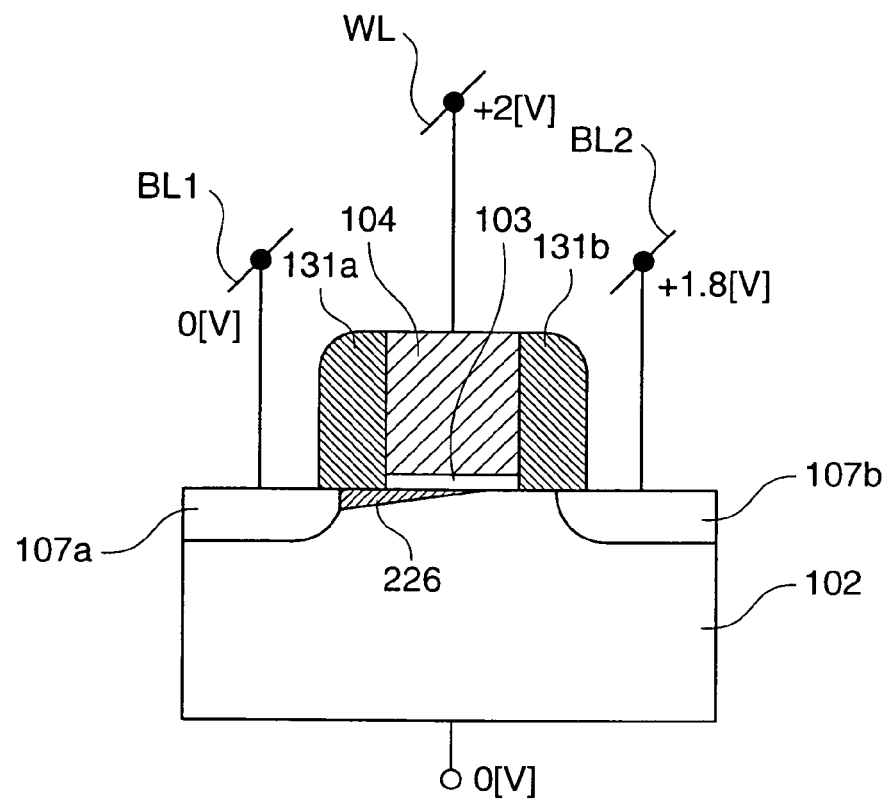
FIG. 7 is a diagram for describing a reading operation of the memory cell (first embodiment) constituting the nonvolatile memory section of the driving device for display according to the present invention.

Further, the principle of reading operation of the memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. A memory cell array can be constructed by connecting a word line WL to the gate electrode 104 of the memory cell, connecting a first bit line BL1 to the first diffusion region 107a, connecting a second bit line BL2 to the second diffusion region 107b, and arranging memory cells.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As obvious from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
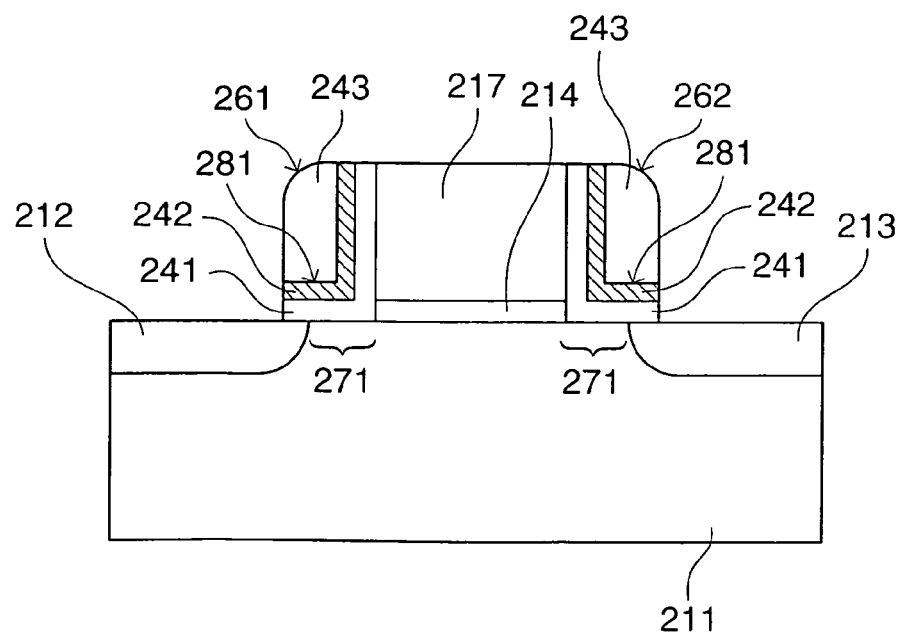
FIG. 8 is a schematic sectional view showing a main part of a memory cell (second embodiment) constituting a nonvolatile memory section of a driving device for display according to the present invention.

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film can be regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
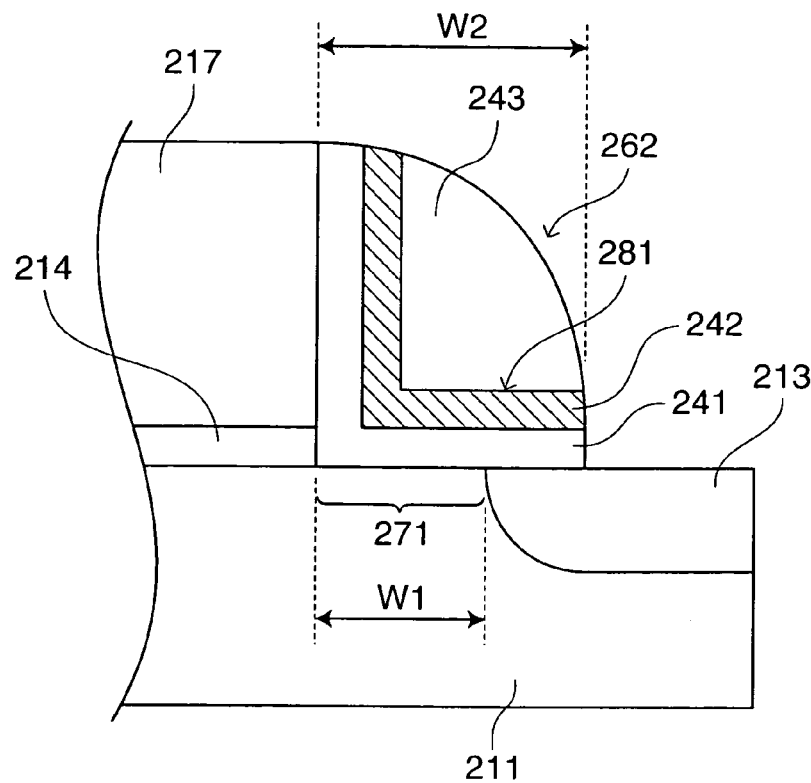
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2-W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
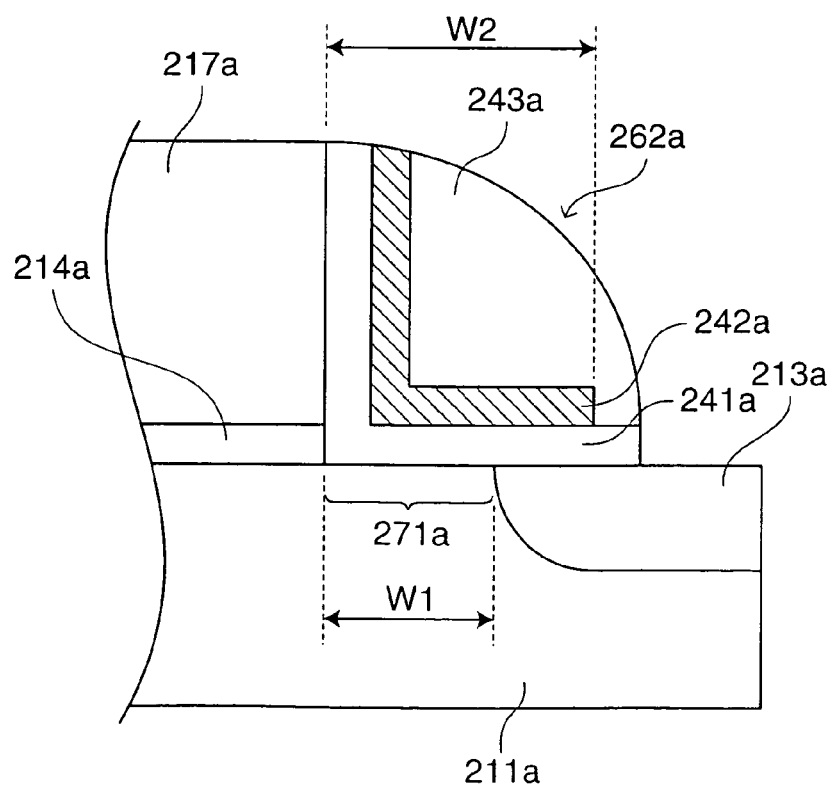
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
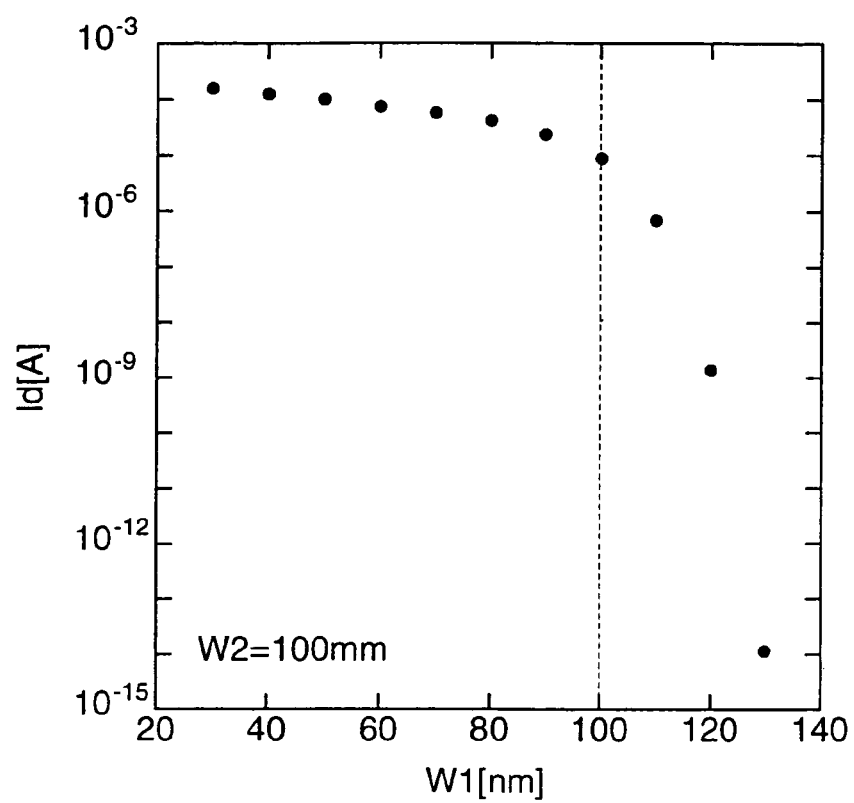
FIG. 11 is a graph showing electric characteristics of the memory cell (second embodiment) constituting the nonvolatile memory section of the driving device for display according to the present invention.

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
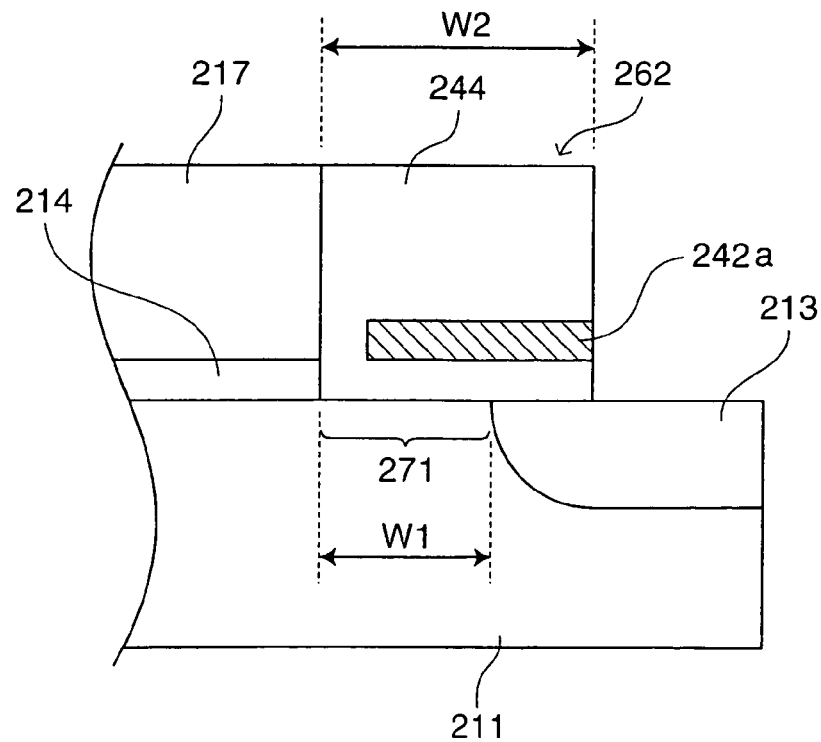
FIG. 12 is a schematic sectional view showing a main part of a modification of the memory cell (second embodiment) constituting the nonvolatile memory section of the driving device for display according to the present invention.

The memory functional unit preferably includes the charge retaining film disposed almost in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface almost parallel with the surface of the gate insulating film 214. In other words, it is preferable that the silicon nitride film 242a is formed at a level parallel to the level corresponding to the surface of the gate insulating film 214.

By the existence of the silicon nitride film 242a almost parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a almost in parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is almost parallel to the surface of the gate insulating film 214 and the channel region (or well region). By the insulating film, dissipation of the charges accumulated in the charge retaining film is suppressed and a memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

Third Embodiment

Figure 13:
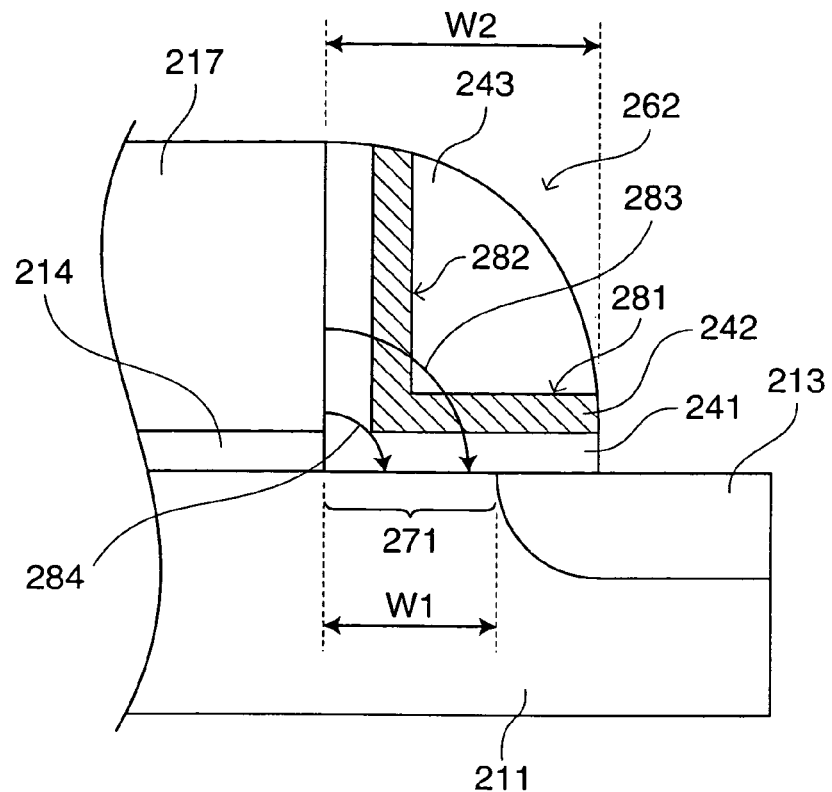
FIG. 13 is a schematic sectional view showing a main part of a memory cell (third embodiment) constituting a nonvolatile memory section of a driving device for display according to the present invention.

The memory functional unit 262 in a semiconductor memory device of a third embodiment has a shape in which the silicon nitride film 242 as a charge retaining film has almost uniform thickness and is disposed almost in parallel with the surface of the gate insulating film 214 as shown in FIG. 13 (region 281) and, further, almost in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film almost parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended almost parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be almost controlled, and charge leak can be prevented.

Fourth Embodiment

In a fourth embodiment, optimization of the gate electrode, the memory functional unit, and the distance between the source and drain regions of a memory cell in a semiconductor memory device will be described.

Figure 14:
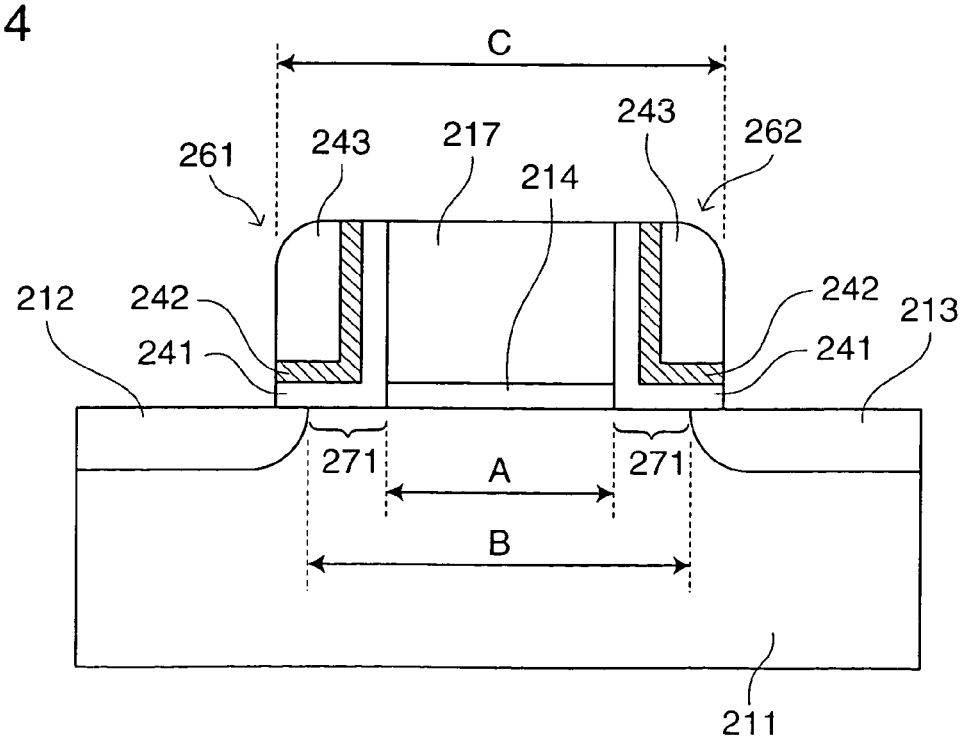
FIG. 14 is a schematic sectional view showing a main part of a memory cell (fourth embodiment) constituting a nonvolatile memory section of a driving device for display according to the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
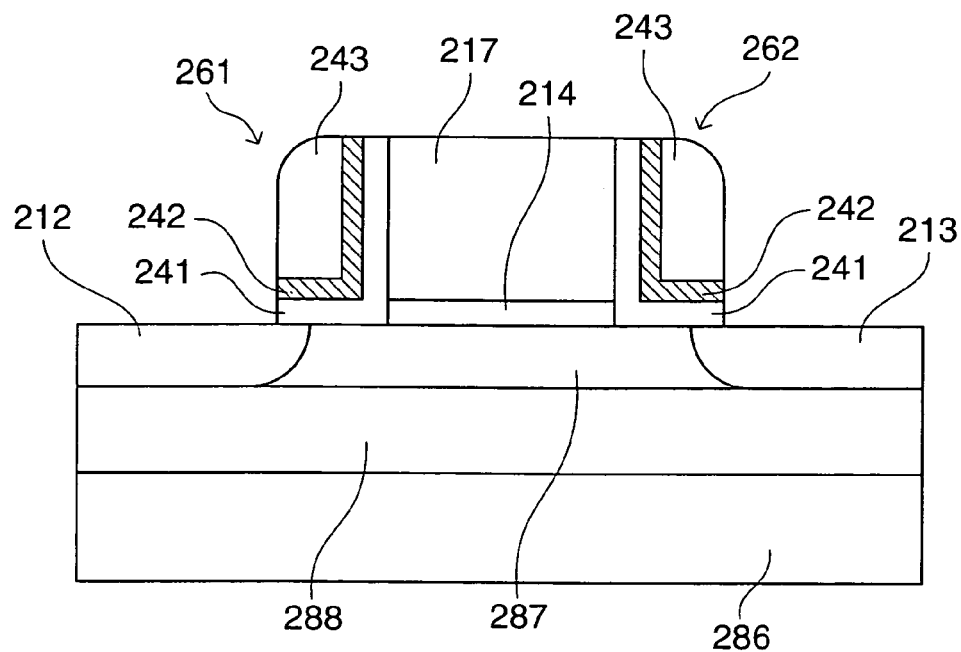
FIG. 15 is a schematic sectional view showing a main part of a memory cell (fifth embodiment) constituting a nonvolatile memory section of a driving device for display according to the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
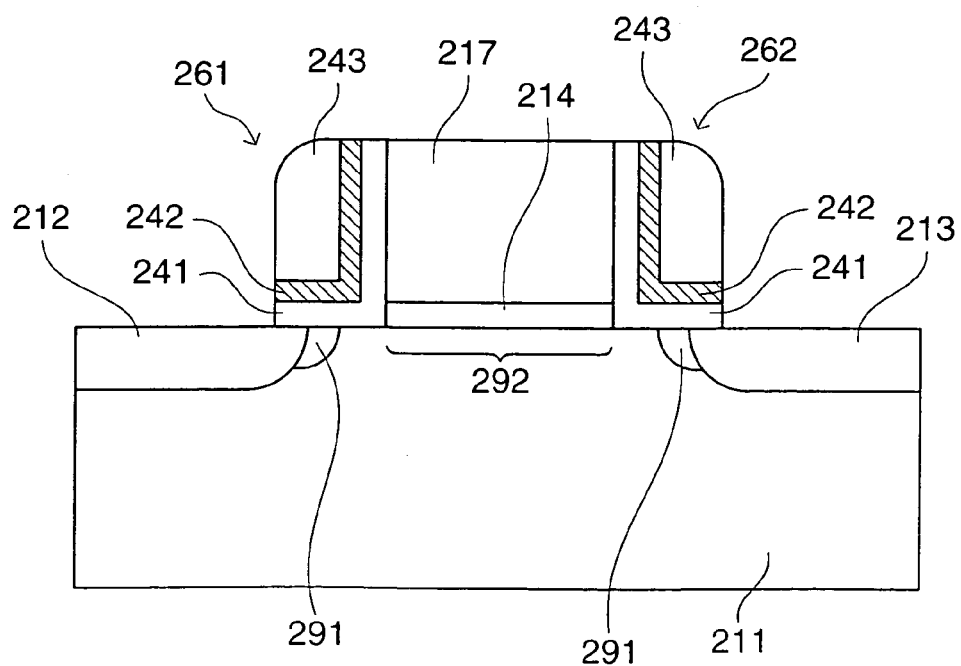
FIG. 16 is a schematic sectional view showing a main part of a memory cell (sixth embodiment) constituting a nonvolatile memory section of a driving device for display according to the present invention.

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
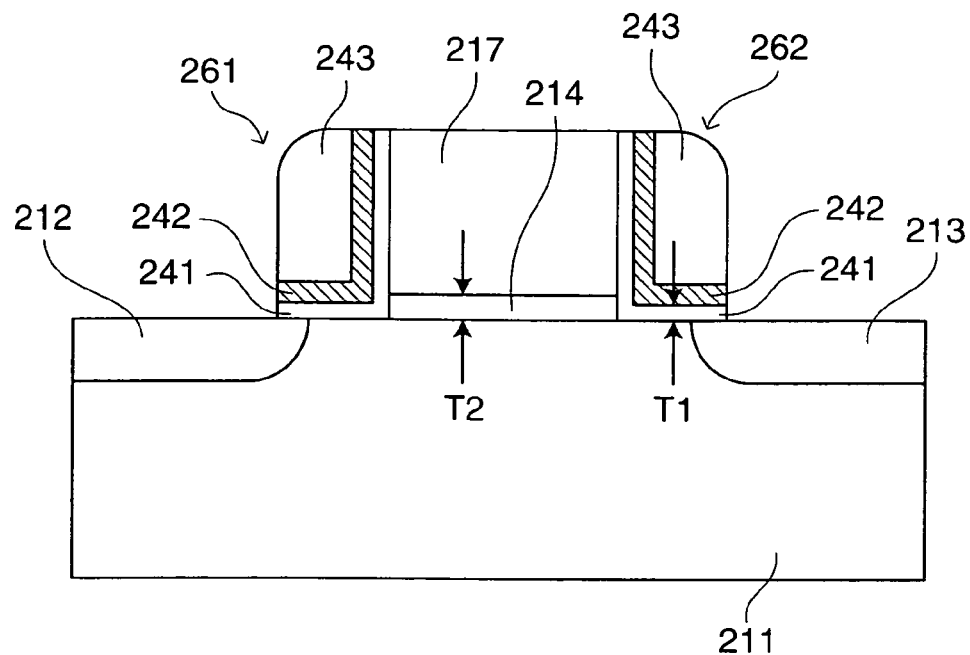
FIG. 17 is a schematic sectional view showing a main part of a memory cell (seventh embodiment) constituting a nonvolatile memory section of a driving device for display according to the present invention.

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the memory cell is inhibited.

As obvious from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
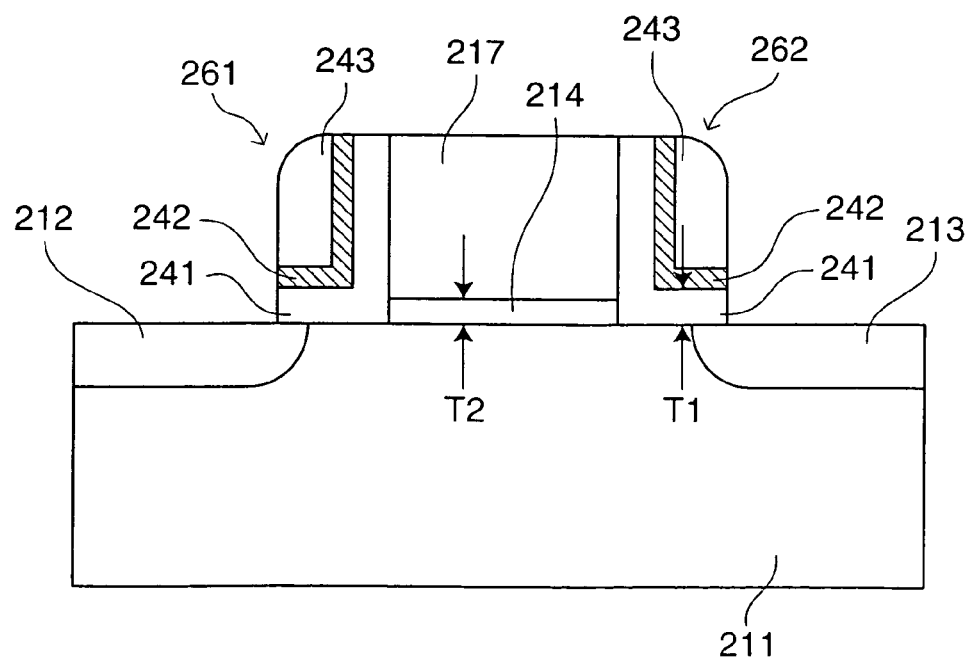
FIG. 18 is a schematic sectional view showing a main part of a memory cell (eighth embodiment) constituting a nonvolatile memory section of a driving device for display according to the present invention.

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
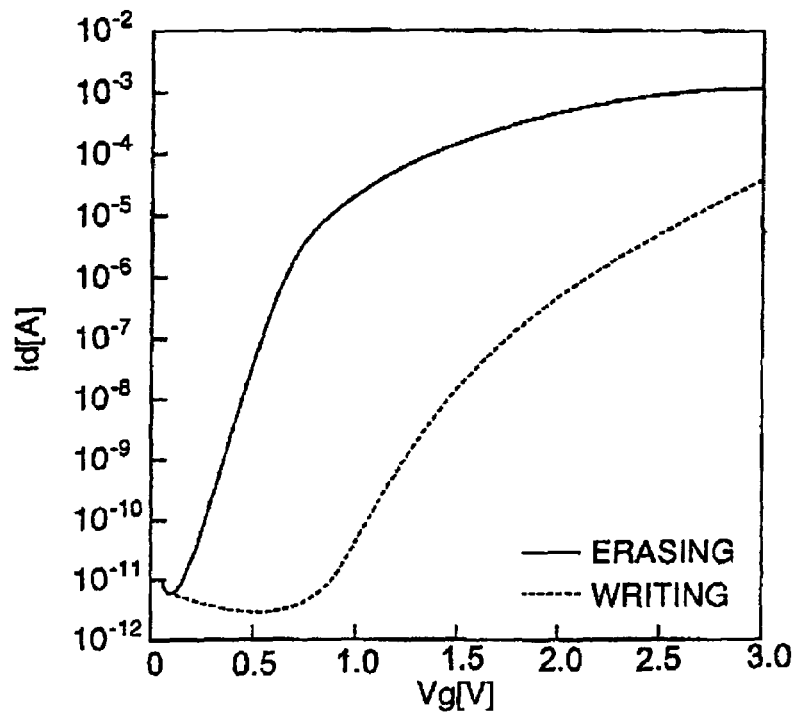
FIG. 19 is a graph showing electric characteristics of a memory cell (ninth embodiment) constituting a nonvolatile memory section of a driving device for display according to the present invention.

In an N-channel type memory cell, when an amount of charges in a memory functional unit changes, a drain current (Id)-gate voltage (Vg) characteristic (actual measurement value) as shown in FIG. 19 is exhibited.

As obvious from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 29).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As obviously understood from the above, in the memory cell in the semiconductor memory device of the present invention, the drain current ratio between the writing operation and the erasing operation can be particularly made high.

The description has been made above on the memory cell forming the nonvolatile memory section in the semiconductor memory device according to the present invention.

Hereinafter, a semiconductor memory device including a nonvolatile memory section having the above-described memory cell and a volatile memory section will be described.

Tenth Embodiment

A tenth embodiment is directed to a semiconductor memory device including a volatile memory section and a nonvolatile memory section having a plurality of memory cells arranged therein. Each of the cells has been described in the first to eighth embodiments.

Figure 20:
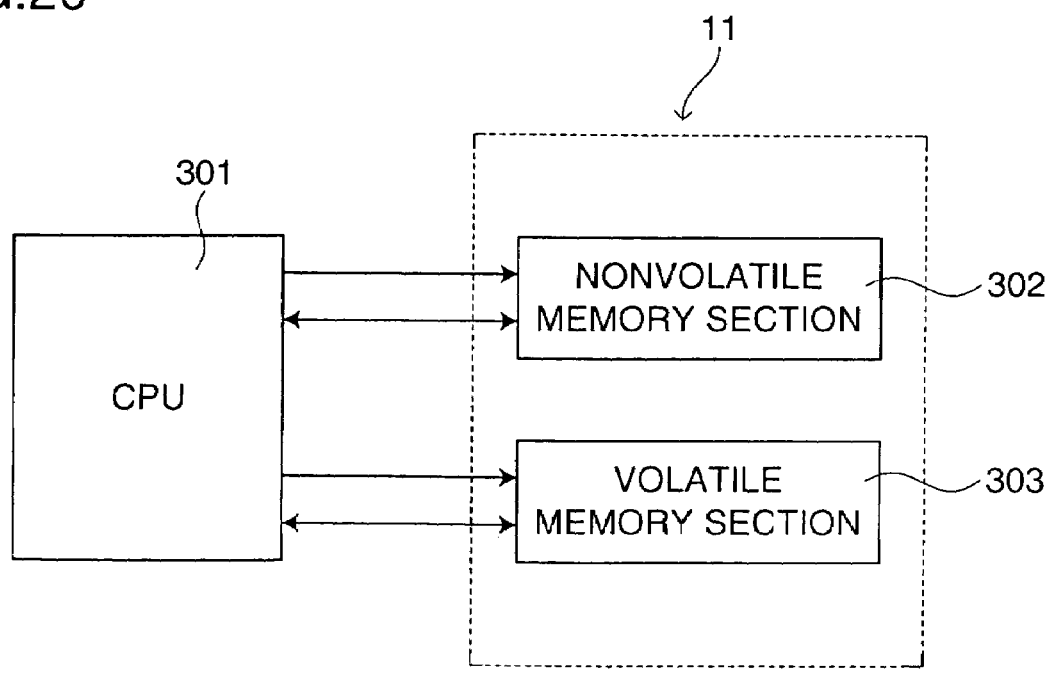
FIG. 20 is a block diagram showing a semiconductor device (tenth embodiment) according to the present invention.

FIG. 20 is a block diagram illustrating the semiconductor memory device in this embodiment. A semiconductor device shown in FIG. 20 includes a semiconductor memory device 11 (indicated by a region surrounded by a dotted line in FIG. 20) and a CPU (Central Processing Unit) 301 forming a logic operation circuit. The semiconductor memory device 11 includes a nonvolatile memory section 302 and a volatile memory section 303.

The nonvolatile memory section 302 is provided with a memory cell array having a plurality of memory cells arranged therein, each of which has been described in the first to eighth embodiments. Furthermore, the nonvolatile memory section 302 is provided with a peripheral circuit section (not shown) for driving the memory cell array.

Figure 21:
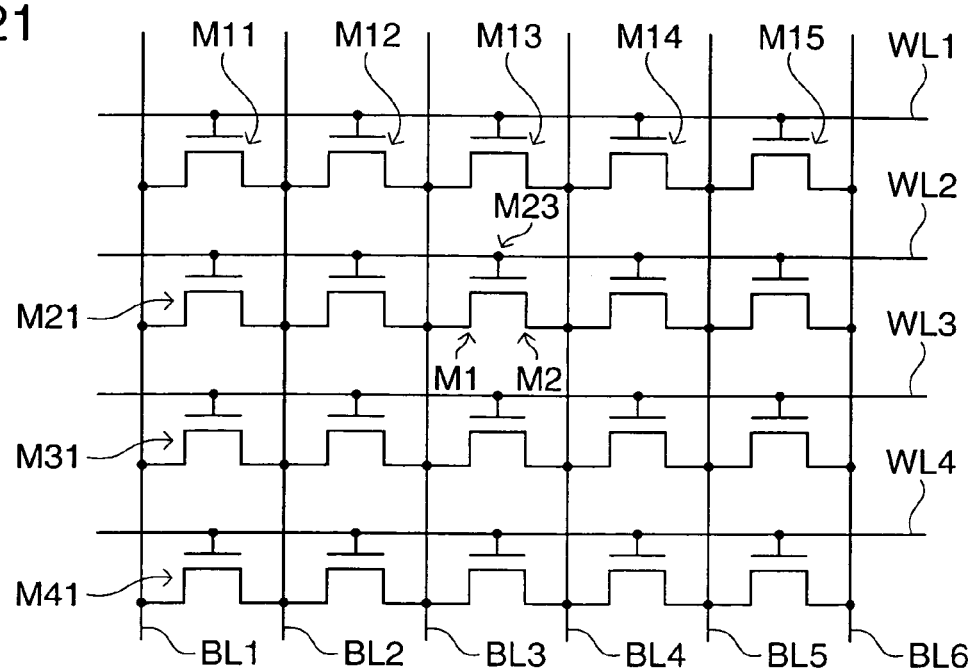
FIG. 21 is a circuit diagram showing a memory cell array of a nonvolatile memory section of the semiconductor device (tenth embodiment) according to the present invention.

FIG. 21 is a circuit diagram illustrating one example of the memory cell array. For the sake of simplification, the memory cell is symbolically shown by a normal field-effect transistor. A memory cell Mij (where i is 1, 2, 3 or 4 and j is 1, 2, 3, 4 or 5) is connected at a gate electrode thereof to a word line WLi (where i is 1, 2, 3 or 4), at one of diffusion layer regions thereof to a bit line BLj (where j is 1, 2, 3, 4 or 5) and at the other diffusion layer region thereof to a bit line BLj (where j is 2, 3, 4, 5 or 6).

Subsequently, description will be given of a method for actuating the memory cell array.

First of all, description will be given of a reading method. Herein, assumed that stored information is read from a memory storage section M1 connected to a bit line BL3 and contained in a memory cell M23. First, the bit line BL3 and another bit line BL4 are precharged to a logic level L and a logic level H, respectively. At this time, it is preferable that a bit line BL2 adjacent to the bit line BL3 on a side opposite to the bit line BL4 should be precharged to a logic level L; in contrast, that a bit line BL5 adjacent to the bit line BL4 on a side opposite to the bit line BL3 should be precharged to a logic level H. After the completion of precharging, a word line WL2 is set to a logic level H. The instant that the word line WL2 is set to the logic level H, the memory cell M23 is turned on. At this moment, a current flows between a source and a drain in the memory cell M23 with the application of a high voltage (the logic level H—the logic level L). Herein, an amount of the current depends on the state of the memory storage section M1. Therefore, the state of the memory storage section M1 can be confirmed by detecting the amount of current flowing in the bit line BL3 or BL4 or monitoring a change in potential of the bit line BL3 or BL4.

In the above-described operation, if the bit line BL2 is not precharged to the logic level L, a memory cell M22 is turned on as soon as the word line WL2 is set to the logic level H, and then, a current disadvantageously flows from the bit line BL2 to the bit line BL3. Such a current inhibits the detection of the current flowing in the selected memory cell M23. Therefore, it is preferable that the bit line BL2 should be precharged to the same logic level L as that of the bit line BL3. In the same manner, it is preferable that the bit line BL5 should be precharged to the same logic level H as that of the bit line BL4.

As described in the ninth embodiment, since the ratio between the drain currents at the time of writing and erasing (reading current ratio) can become remarkably great in the memory cell, the discrimination between a writing state and an erasing state becomes easy. Consequently, in the case where the above-described memory cell is used as the nonvolatile memory section in the semiconductor memory device according to the present invention, the reading speed of the information stored in the nonvolatile memory section can be increased, or the arrangement of a reading circuit of the nonvolatile memory section can be simplified.

Next, description will be given of a rewriting method. Herein, a rewriting operation signifies writing or erasing data in a memory cell. In order to write or erase data, a proper voltage is applied to each of the word and bit lines in such a manner as to apply the voltage described in the first embodiment to each of terminals in the memory cell to be written or erased. For example, in the case where data is written in the memory storage section M1 in the memory cell M23, a voltage of +5 V is applied to the bit line BL3; 0 V is applied to the bit line BL4; +5 V is applied to the word line WL2; and 0 V is applied to other word lines WL1, WL3 to WL5; in contrast, other bit lines BL1, BL2, BL5 and BL6 are released.

The volatile memory section 303 is constructed by, for example, an SRAM. The SRAM may be of a general 6-transistor type, or of a 4-transistor type having a smaller occupied area. The SRAM has a feature in that it does not require any refreshing operation and current consumption at the time of non-operation (i.e., standby) is small.

The CPU 301 is connected to the nonvolatile memory section 302 and the volatile memory section 303, which constitute the semiconductor memory device 11 to thus give a command to each of the memory sections and transmit/receive data to/from each of the memory sections. The nonvolatile memory section 302 stores data, which need not be frequently rewritten, such as program codes or character data required for the operation of the CPU 301. On the other hand, the volatile memory section 303 is used as a work memory such as a cache. As necessary, a part of the nonvolatile memory section 302 may be used as a work memory.

The nonvolatile memory section 302 includes the memory cells described in the first to eighth embodiments. The memory cell described in the first to eighth embodiments can be readily miniaturized as described already and, further, can be easily fabricated in comparison with an EEPROM having a floating gate, whereby it can be fabricated at a reduced cost. As a consequence, it is possible to provide the semiconductor memory device including both of the nonvolatile memory section and the volatile memory section at low cost. Moreover, since the difference in current at the time of writing and erasing can be readily made great in the memory cell, the information stored in the nonvolatile memory section can be read at an improved speed or the arrangement of the reading circuit for the nonvolatile memory section can be simplified in the case where the above-described memory cell is used as the nonvolatile memory section in the semiconductor memory device according to the present invention.

The semiconductor device including the semiconductor memory device according to the present invention and the logical operation section (CPU) can be fabricated at a reduced cost.

As the memory cell for use in the nonvolatile memory section in the present embodiment is preferably used the memory cell in the seventh embodiment. That is, in the seventh embodiment, the thickness T1 of the insulating film for separating the charge retaining film (silicon nitride film 242) from the channel region or well region is smaller than the thickness T2 of the gate insulating film and but not smaller than 0.8 nm. If such a memory cell is used as the nonvolatile memory section, the voltages in the writing operation and the erasing operation can be decreased, and the writing operation and the erasing operation can be performed at a high speed. Additionally, since the memory effect of the memory cell is enhanced, the reading speed of the nonvolatile memory section can be increased. Thus, it is possible to reduce the power consumption and achieve the high speed operation in the semiconductor memory device.

As the memory cell for use in the nonvolatile memory section in the present embodiment is preferably used the memory cell in the eighth embodiment. That is, in the eighth embodiment, the thickness T1 of the insulating film for separating the charge retaining film (silicon nitride film 242) from the channel region or well region is greater than the thickness T2 of the gate insulating film but not greater than 20 nm. If such a memory cell is used as the nonvolatile memory section, a satisfactory information retention characteristics can be achieved even when the nonvolatile memory section is highly integrated since the retention characteristics can be improved without degrading the short channel effect of the memory cell. Consequently, it is possible to increase the memory capacity of the semiconductor memory device and reduce the fabricating cost of the semiconductor memory device.

It is preferable for the memory cell for use in the nonvolatile memory section in the present embodiment that the region retaining charges (silicon nitride film 242) in the memory functional units 261 and 262 overlaps with the diffusion regions 212 and 213, respectively, as described in the second embodiment. If such a memory cell is used as the nonvolatile memory section, the reading speed of the nonvolatile memory section can be sufficiently increased. Thus, it is possible to achieve the high speed operation in the semiconductor memory device.

It is preferable for the memory cell for use in the nonvolatile memory section in the present embodiment that the memory functional unit includes the charge retaining film arranged almost in parallel to the surface of the gate insulating film, as described in the second preferred embodiment. If such a memory cell is used as the nonvolatile memory section, it is possible to reduce variations in memory effect of the memory cell, so as to suppress variations in reading current in the nonvolatile memory section. In addition, it is possible to reduce a change in characteristics of the memory cell during the information retaining operation, so as to enhance the information retention characteristics of the nonvolatile memory section. Thus, the reliability of the semiconductor memory device is enhanced.

It is preferable for the memory cell for use in the nonvolatile memory section in the present embodiment that the memory functional unit includes the charge retaining film arranged almost in parallel to the surface of the gate insulating film and the portion extending almost in parallel to the side face of the gate insulating film, as described in the third embodiment. If such a memory cell is used as the nonvolatile memory section, it is possible to increase the rewriting speed of the memory cell, so as to perform the rewriting operation at a high speed in the nonvolatile memory section. Thus, it is possible to achieve the high speed operation in the semiconductor memory device.

The memory cell in the already described best preferred embodiment is optimally used as the memory cell for use in the nonvolatile memory section in the present embodiment. Thus, it is possible to achieve the most excellent performance of the nonvolatile memory section in the semiconductor memory device.

Eleventh Embodiment

A semiconductor device of an eleventh embodiment is different from the semiconductor device of the tenth preferred embodiment in that there are a plurality of CPUs forming logic operation circuits, in which each of the CPUs has a semiconductor memory device.

Figure 22:
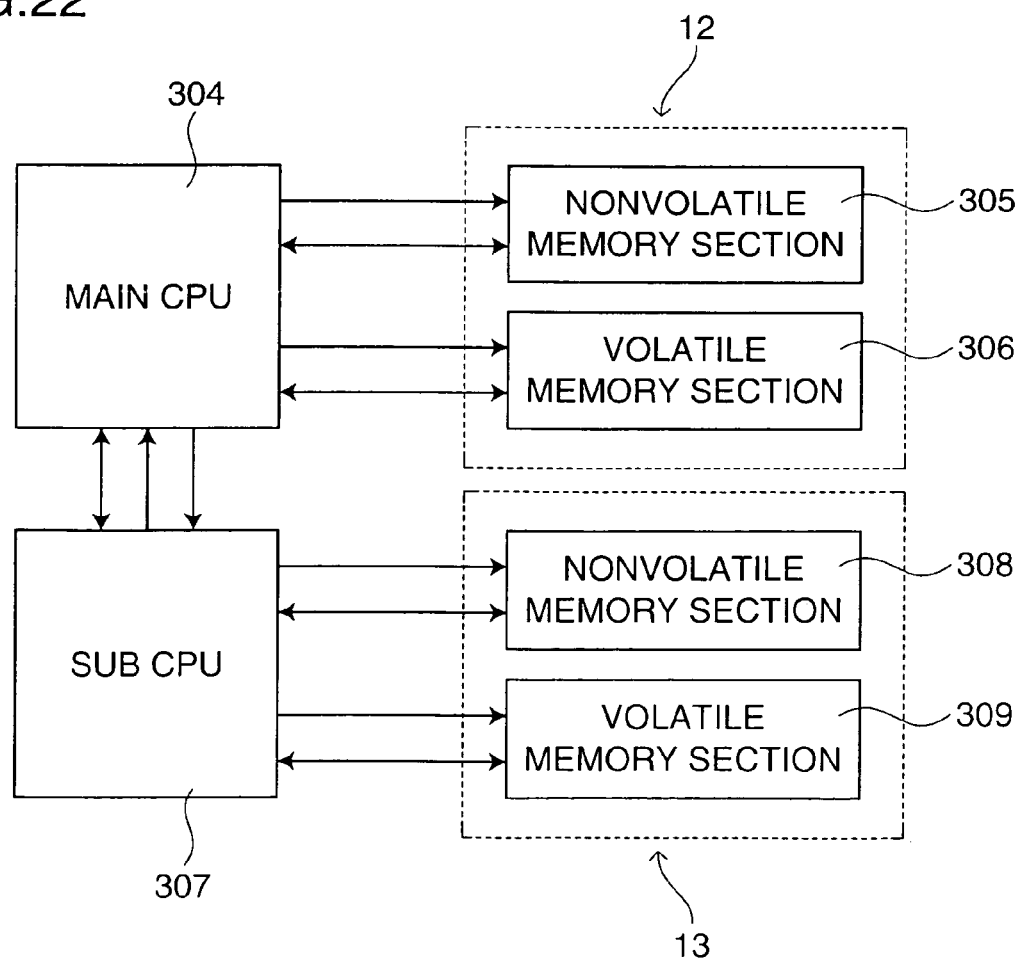
FIG. 22 is a block diagram showing a semiconductor device (eleventh embodiment) according to the present invention.

As shown in FIG. 22, the semiconductor device in the present embodiment includes a main CPU 304 and a sub CPU 307, which include semiconductor memory devices 12 and 13, respectively. The semiconductor memory devices 12 and 13 include nonvolatile memory sections 305 and 308 and volatile memory sections 306 and 309, respectively.

In the case where the semiconductor device in the present embodiment is incorporated in, for example, a cellular telephone, the main CPU 304 serves as a CPU for a base band section for performing the processing relative to a data communication protocol or basic telephone function; in contrast, the sub CPU 309 serves as a CPU for applications for performing the processing relative to an application such as Java (registered trademark). Although the semiconductor device in the present embodiment includes the two sets of the CPUs and the semiconductor memory devices, it may include three or more sets.

There are provided the plurality of CPUs forming the logic operation circuits, and further, each of the CPUs is combined with the semiconductor memory device having the nonvolatile memory section and the volatile memory section, thus achieving a more highly functional operation.

Twelfth Embodiment

In a twelfth embodiment, the semiconductor memory devices in the tenth or eleventh embodiment are mounted in a single package.

Figure 23:
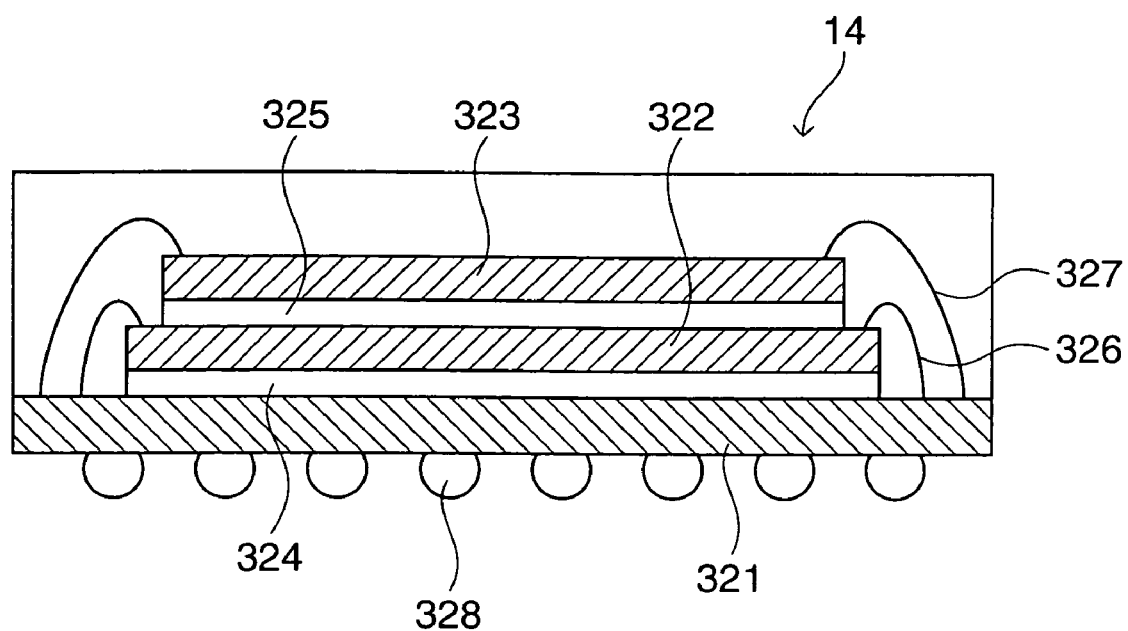
FIG. 23 is a schematic sectional view showing a semiconductor memory device (twelfth embodiment) according to the present invention.

Each of the semiconductor memory devices 11, 12 and 13 in the tenth and eleventh preferred embodiments has the nonvolatile memory section and the volatile memory section. As shown in FIG. 23, a chip 322 having a nonvolatile memory section formed therein and a chip 323 having a volatile memory section formed therein are mounted in a single package 14. In FIG. 23, a reference numeral 321 denotes a PCB (Printed Circuit Board); reference numerals 324 and 325 denote insulators; reference numerals 326 and 327 denote gold wires; and a reference numeral 328 denotes a solder ball.

The chip having the nonvolatile memory section formed therein and the chip having the volatile memory section formed therein are mounted in the single package, so that the semiconductor memory device can be reduced in size. For example, since the miniaturization of parts is earnestly demanded, in particular, in the case of a cellular telephone, it is preferable that the semiconductor memory device in the present embodiment is used. It is noted that the CPU forming the logical operation section may be mounted in combination in the single package in addition to the semiconductor memory device. In this case, the semiconductor device including the CPU can be reduced in size.

Thirteenth Embodiment

In a thirteenth embodiment, the semiconductor memory devices in the tenth or eleventh embodiment are mounted in a single chip.

As a memory cell constituting a nonvolatile memory section is used the memory cell described in the first to eighth embodiments. The process for forming the memory cell described in the first to eighth embodiments has high affinity with the process for forming a normal transistor. Moreover, the volatile memory section is constituted of, for example, an SRAM. The SRAM is constituted of normal transistors in combination. Therefore, semiconductor memory device in the present embodiment can be readily formed in the process with high affinity with the process for forming a normal transistor.

Figure 24:
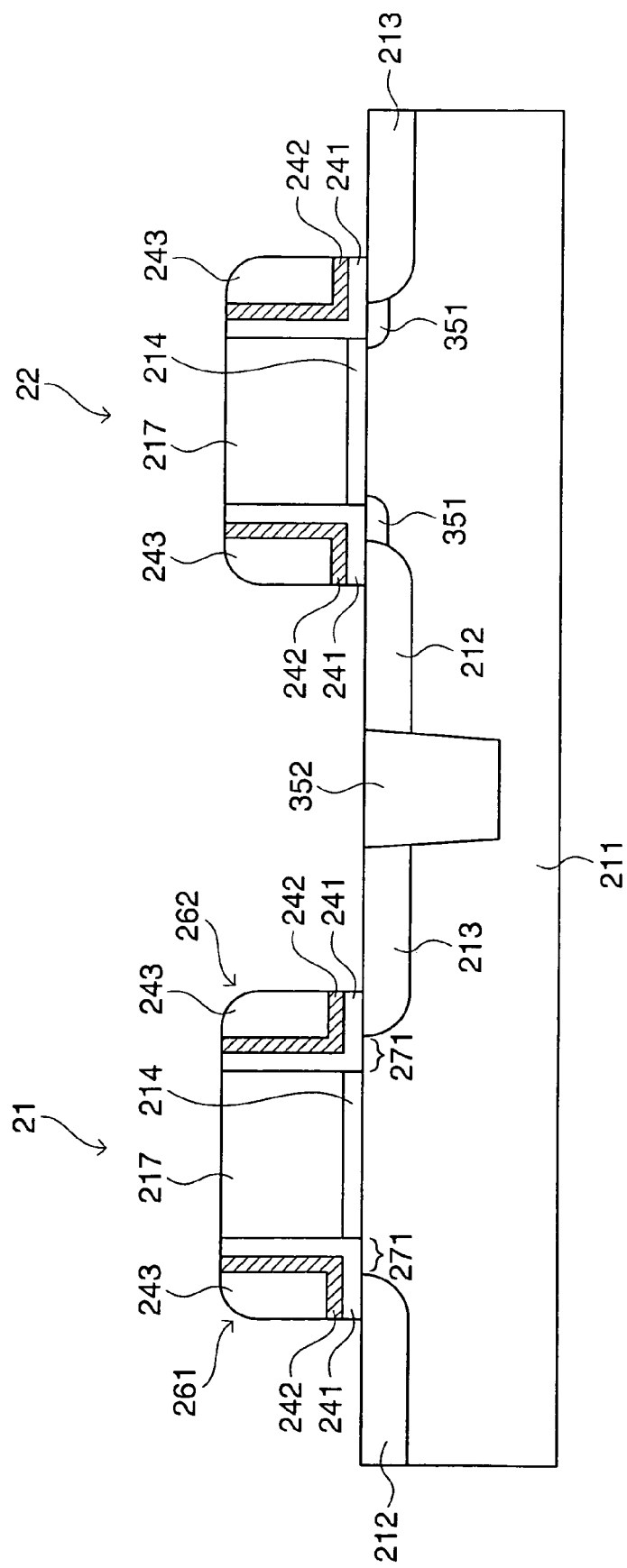
FIG. 24 is a sectional view schematically describing a semiconductor memory device (thirteenth embodiment) according to the present invention.

FIG. 24 is a sectional view schematically showing a device constituting the nonvolatile memory section and a device constituting the volatile memory section formed on a single chip. The memory cell constituting the nonvolatile memory section has the structure shown in, for example, FIG. 8 in the second embodiment. It is noted that the description of the constituent elements designated by the reference numerals in FIG. 8 will be omitted below. Although the SRAM in the volatile memory section may be constituted of a complementary type MOS, an NMOS is shown only in cross section in FIG. 24 for the sake of simplification.

A memory cell 21 in the nonvolatile memory section and a transistor 22 constituting the SRAM in the volatile memory section are formed on a single semiconductor substrate 211. The transistor 22 is a MOSFET with a normal structure. Herein, a gate sidewall insulating film at the transistor 22 is configured such that a silicon nitride film 242 is sandwiched by silicon oxide film memory cells 241 and 243, which is the same structure as that of a gate sidewall insulating film at the memory cell 21. In FIG. 24, the difference in structure between the memory cell 21 and the transistor 22 resides in that the transistor 22 has an LDD (Lightly Doped Drain) region or an extension region 351 while the memory cell 21 does not have any LDD region or any extension region. A reference numeral 352 denotes a device isolation region.

The semiconductor memory device in the present preferred embodiment can be formed in accordance with the following procedures.

First, a gate insulating film 214 and a gate electrode 217 are formed on a semiconductor substrate 211 in accordance with a known procedure.

Next, after photoresist coating, patterning is performed in such a manner that a photoresist remains at the memory cell 21 in the nonvolatile memory section. Thereafter, N-type impurities are injected by using the photoresist and the gate electrode 217 as masks, thereby forming the LDD region or the extension region 351. As is clear from the above description, no LDD region or extension region is formed on the memory cell 21.

Subsequently, a multilayered film consisting of a silicon oxide film/a silicon nitride film/a silicon oxide film is formed over the entire surface of the substrate 211, followed by etching back by anisotropic etching, thereby forming a gate sidewall insulating film.

Next, N-type impurities are injected by using the gate insulating film 214 and the gate sidewall insulating film as masks, thereby forming diffusion regions 212 and 213.

Thereafter, an upper wiring is formed by a known method, thereby leading to the completion of a semiconductor memory device.

Here, in order to optimize the performance of the memory cell 21, a well region is formed inside of the semiconductor substrate 211, or the impurity concentration in the well region in the memory cell 21 may be made different from that in the well region in the transistor 22. Otherwise, the impurity concentration in the diffusion region in the memory cell 21 may be made different from that in the diffusion region in the transistor 22.

As is clear from the above-described procedures, the nonvolatile memory section and the volatile memory section can be formed on the single chip in the very easy process. In particular, the number of processes can be remarkably reduced in comparison with the case where the nonvolatile memory section includes an EEPROM having a floating gate. Consequently, it is possible to reduce the size of the semiconductor memory device and, further, to remarkably reduce the cost of the semiconductor memory device.

It is noted that since a CPU including a logic operation circuit also includes a transistor of a normal structure, the CPU also can be readily mounted on the single chip in combination in addition to the above-described semiconductor memory device. In this case, it is possible to reduce the size of the semiconductor device inclusive of the CPU.

Fourteenth Embodiment

A fourteenth embodiment is different from the tenth or eleventh embodiment in that a volatile memory section is includes a DRAM.

Figure 25:
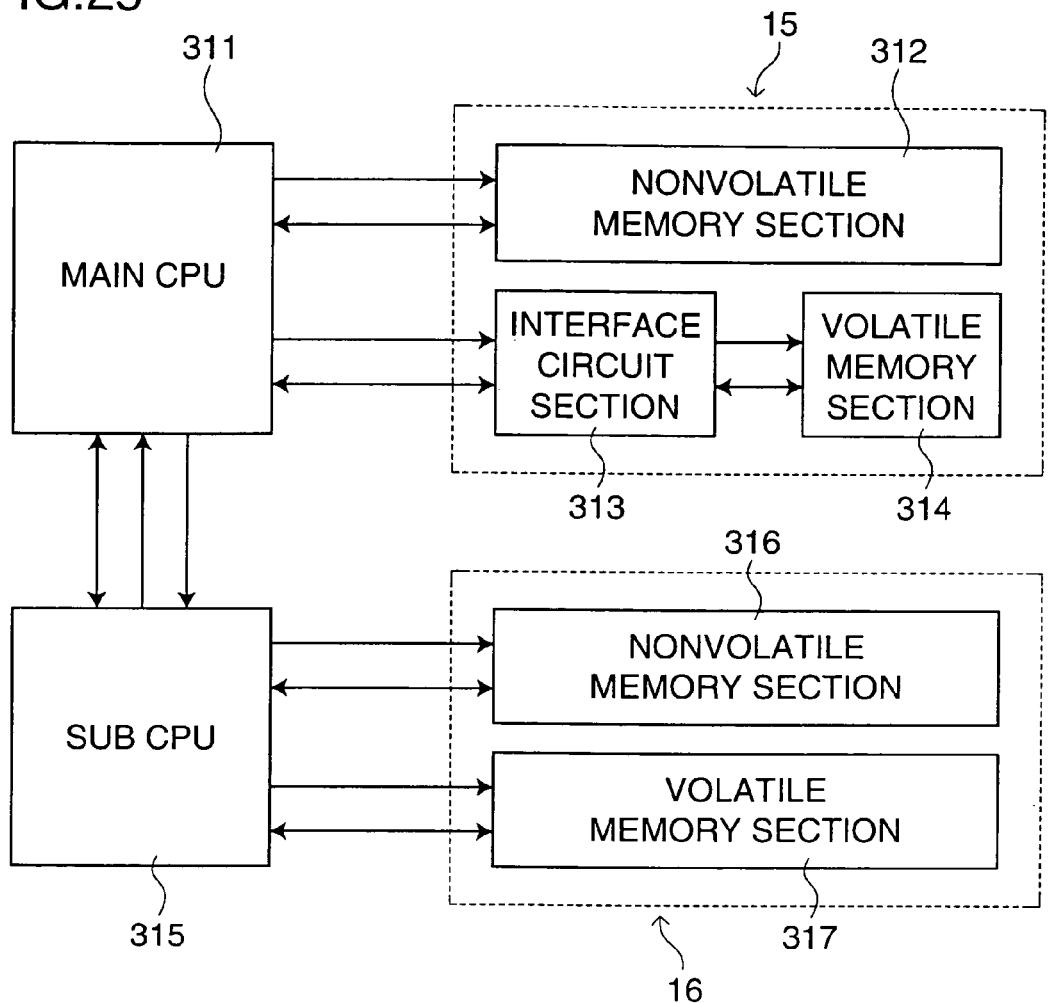
FIG. 25 is a block diagram showing a semiconductor device (fourteenth embodiment) according to the present invention.

As shown in FIG. 25, a main CPU 311 and a sub CPU 315 include semiconductor memory devices 15 and 16, respectively. The semiconductor memory device 15 includes a nonvolatile memory section 312, a volatile memory section 314 constituted of a DRAM and an interface circuit section 313. It is preferable that the interface circuit section 313 has a function for automatically performing a refreshing operation of the volatile memory section 314 constituted of a DRAM. In this manner, the main CPU 311 disposed outside of the semiconductor memory device 15 need not perform any refreshing operation with respect to the volatile memory section 314, or need not issue a command for performing the refreshing operation with respect to the volatile memory section 314. Consequently, the design of the main CPU 311 becomes easy. In particular, in the case where the main CPU 311 is a versatile type, it is possible to produce an enhanced effect of reducing a cost required for changing the design.

Furthermore, it is preferable that the main CPU 311 controls the volatile memory section 314 constituted of a DRAM in the same manner as in the case of an SRAM, and therefore, that the interface circuit section 313 has a function of such a control. In other words, it is more preferable that the volatile memory section 314 and the interface circuit section 313 integrally serve as a pseudo SRAM.

Although the semiconductor memory device 16 includes a nonvolatile memory section 316, a volatile memory section 317 consisting of an SRAM, it is understood that it may be configured in the same manner as the semiconductor memory device 15.

The use of the DRAM for the volatile memory section can remarkably reduce an area occupied per bit. Thus, it is possible to reduce the cost of the semiconductor memory device or increase the memory capacity.

Fifteenth Embodiment

Figure 26:
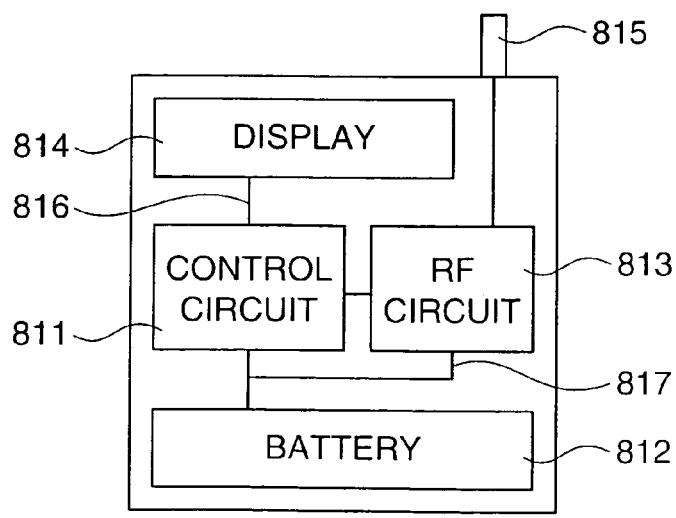
FIG. 26 is a schematic block diagram showing a portable electronic apparatus (fifteenth embodiment) according to the present invention.
Figure 27:
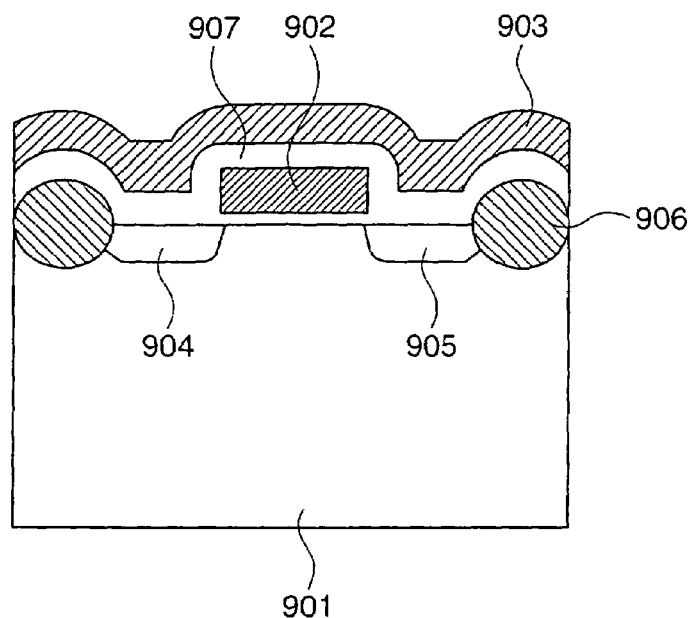
FIG. 27 is a schematic sectional view showing a main part of a conventional flash memory.
Figure 28:
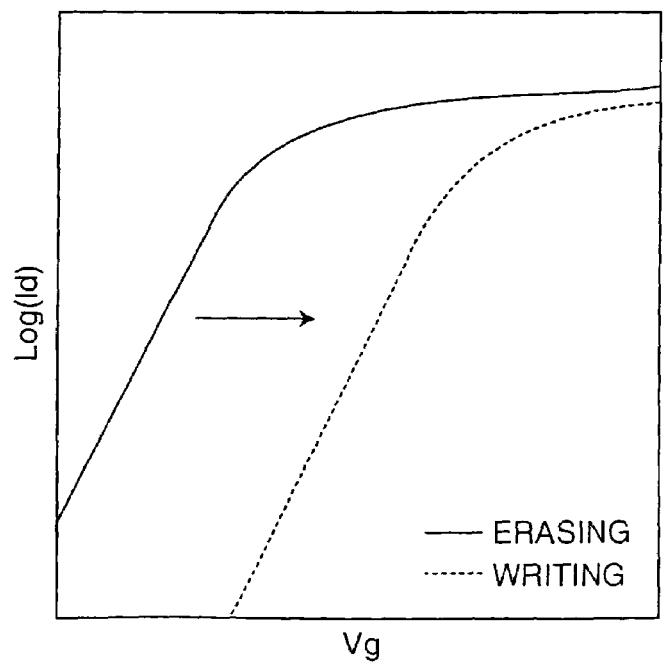
FIG. 28 is a graph showing electric characteristics of a conventional flash memory.

FIG. 26 shows a cellular telephone as a portable electronic apparatus incorporating the above-described semiconductor memory device or semiconductor device therein.

The cellular telephone is mainly constructed by a control circuit 811, a battery 812, an RF (Radio Frequency) circuit 813, a display 814, an antenna 815, a signal line 816 and a power source line 817. The control circuit 811 incorporates therein the above-described semiconductor memory device or semiconductor device, thereby providing an inexpensive portable electronic apparatus.

As is obvious from the above description, in the semiconductor memory device according to the first aspect of the present invention, since the nonvolatile memory section includes the memory cell which can be readily fined in the simple fabricating process, it is possible to provide the semiconductor memory device including both of the nonvolatile memory section and the volatile memory section at low cost. Furthermore, since the difference in current at the time of writing and erasing is easily enlarged in the memory cell, it is possible to increase the reading speed of information stored in the nonvolatile memory section, or to simplify the arrangement of the reading circuit in the nonvolatile memory section.

In the preferred embodiment, since the volatile memory section includes the SRAM, it is possible to suppress the electric power consumption in the semiconductor memory device.

Furthermore, in the preferred embodiment, since the nonvolatile memory cell and the SRAM are formed on the single chip, the process for forming the nonvolatile memory section has high affinity with the process for forming the transistor having the normal structure. The SRAM can be constituted of the transistor having the normal structure, so that the nonvolatile memory section and the volatile memory section can be mounted in combination on the single chip in the very easy process. Consequently, the semiconductor memory device can be reduced in size and, further, the semiconductor memory device can be remarkably reduced in cost.

Moreover, in the preferred embodiment, since the volatile memory section includes the DRAM, it is possible to remarkably reduce the area occupied per bit in the volatile memory section. As a consequence, it is possible to reduce the cost of the semiconductor memory device, or to increase the memory capacity.

Additionally, in the preferred embodiment, since the volatile memory section further includes refreshing operation means for refreshing the DRAM in the case of the combination of the external controller such as the CPU with the semiconductor memory device, the external controller need not perform any refreshing operation of the volatile memory section, or need not issue the command for performing the refreshing operation with respect to the volatile memory section. Consequently, it is possible to facilitate the design of the external controller. In particular, it is possible to readily make the external controller versatile.

In addition, in the preferred embodiment, since the chip having the nonvolatile memory section formed therein and the other chip having the volatile memory section formed therein are mounted in the single package, the semiconductor memory device can be reduced in size.

Furthermore, in the semiconductor device according to the second aspect of the present invention, since the semiconductor device includes the semiconductor memory device having the memory cell which can be readily fined in the simple fabricating process and the logical operation section, it is possible to provide the semiconductor device capable of performing various kinds of operations at low cost.

Moreover, in the preferred embodiment, since at least a part of the memory functional unit overlaps with a part of the diffusion region, it is possible to sufficiently increase the reading speed of the nonvolatile memory cell. Consequently, the semiconductor memory device can be actuated at the high speed.

Additionally, in the preferred embodiment, since the memory functional unit includes the film having the function of retaining charges and the surface of the film having the function of retaining charges is arranged almost in parallel to the surface of the gate insulating film, it is possible to reduce variations in memory effect of the nonvolatile memory cell, so as to suppress variations in reading current of the nonvolatile memory cell. Furthermore, it is possible to reduce variations in characteristics of the nonvolatile memory cell during the information retaining operation, so as to enhance the information retention characteristics of the nonvolatile memory cell. As a consequence, the reliability of the semiconductor memory device is enhanced.

In addition, in the preferred embodiment, since the film having the function of retaining charges is arranged almost in parallel to the side surface of the gate electrode, it is possible to perform the rewriting operation of the nonvolatile memory cell at the high speed since the rewriting speed of the nonvolatile memory cell is increased. As a result, the semiconductor memory device can be actuated at the high speed.

Furthermore, in the preferred embodiment, since the memory functional unit includes the film having the function of retaining charges and the insulating film for separating the film from the channel region or the semiconductor layer and the insulating film has the thickness smaller than that of the gate insulating film and is 0.8 nm or more, it is possible to reduce the voltage during the writing operation and the erasing operation in the nonvolatile memory cell, or to perform the writing operation and the erasing operation at the high speed. Furthermore, since the memory effect of the nonvolatile memory cell is enhanced, the reading speed of the nonvolatile memory section can be increased. Thus, the semiconductor memory device can be actuated at the high speed with the reduced electric power consumption.

Moreover, in the preferred embodiment, since the memory functional unit includes the film having the function of retaining charges and the insulating film for separating the film from the channel region or the semiconductor layer and the insulating film has the thickness greater than that of the gate insulating film and is 20 nm or less, the satisfactory information retention characteristics can be achieved even when the nonvolatile memory cell is highly integrated since the retention characteristics can be improved without degrading the short channel effect of the nonvolatile memory cell. Consequently, it is possible to increase the memory capacity of the semiconductor memory device, or to reduce the fabricating cost of the semiconductor memory device.

Additionally, in the portable electronic apparatus according to the third aspect of the present invention, since the portable electronic apparatus includes the inexpensive semiconductor memory device according to the first aspect of the present invention or the semiconductor device according to the second aspect of the present invention, it is possible to reduce the fabricating cost of the portable electronic apparatus.

What is claimed is:

1. A portable electronic apparatus comprising a semiconductor memory device comprising:
    a nonvolatile memory section; and
    a volatile memory section, wherein
    the nonvolatile memory section includes a nonvolatile memory cell having a single gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges, wherein each of said memory functional units are an insulator film, wherein
    the nonvolatile memory cell and the volatile memory cell are formed on a single chip having a common semiconductor substrate.

2. A portable electronic apparatus comprising a semiconductor memory device comprising:
    a nonvolatile memory section;
    a volatile memory section, wherein
    the nonvolatile memory section includes a nonvolatile memory cell having a single gate electrode formed on a semiconductor layer via a gate insulating film, a channel region disposed under the gate electrode, a diffusion regions disposed on both sides of the channel region and having a conductive type opposite to that of the channel region, and memory functional units formed on both sides of the gate electrode and having a function for retaining charges; wherein each of said memory functional units are an insulator; and
    a logical operation section for performing operation processing on the basis of information stored in the semiconductor memory device, wherein
    the nonvolatitle memory cell and the volatile memory cell are formed on a single chip having a commom semiconductor substrate.

3. The portable electronic apparatus according to claim 1, wherein
    the volatile memory section includes an SRAM.

4. The portable electronic apparatus according to claim 1, wherein
    the volatile memory section includes a DRAM.

5. The portable electronic apparatus according to claim 4, wherein
    the volatile memory section includes refreshing operation means for refreshing the DRAM.

6. The portable electronic apparatus according to claim 1, further comprising:
    a first chip forming the nonvolatile memory section;
    a second chip forming the volatile memory section; and
    a single package containing therein the first chip and the second chip.

7. The portable electronic apparatus according to claim 1, wherein
    at least a part of the memory functional units overlaps with a part of the diffusion region.

8. The portable electronic apparatus according to claim 1, wherein said volatile memory section has substantially the same structure as the nonvolatile memory section, except that said volatile memory section has additional extension regions adjacent to the diffusion regions on both sides of the channel region.

9. The semiconductor memory device according to claim 8, wherein said extension regions of said volatile memory section are lightly doped drain regions.

10. The portable electronic apparatus according to claim 1,
    wherein said insulator film as each memory functional unit is
    a film having a function of accumlating or trapping charges or a function of holding a charge polarized state, in which said insulator film includes a silicon nitride film;
    said insulator film has therein a conductor film or a semiconductor layer;
    said insulator film has therein one or more dots made of a conductor or semiconductor; or
    said insulator film is a single layer or a lamination layer that includes a ferroelectric film in which internal charges are polarized by an electric field and its state is held.

* * * * *